United States Patent
Finateu et al.

(10) Patent No.: US 12,250,488 B2
(45) Date of Patent: Mar. 11, 2025

(54) MERGED FRAME-BASED AND EVENT-BASES IMAGE SENSOR PIXEL

(71) Applicant: PROPHESEE, Paris (FR)

(72) Inventors: Thomas Finateu, Veneux les sablons (FR); Christian Bouvier, Paris (FR)

(73) Assignee: Prophesee, Paris (FR)

( * ) Notice: Subject to any disclaimer, the term of this patent is extended or adjusted under 35 U.S.C. 154(b) by 0 days.

(21) Appl. No.: 18/393,218

(22) Filed: Dec. 21, 2023

(65) Prior Publication Data

US 2024/0214708 A1    Jun. 27, 2024

(30) Foreign Application Priority Data

Dec. 21, 2022   (EP) ..................................... 22315345

(51) Int. Cl.
*H04N 25/78* (2023.01)
*H01L 27/146* (2006.01)

(52) U.S. Cl.
CPC ....... *H04N 25/78* (2023.01); *H01L 27/14607* (2013.01); *H01L 27/1461* (2013.01)

(58) Field of Classification Search
CPC .............. H04N 25/78; H01L 27/14607; H01L 27/1461
See application file for complete search history.

(56) References Cited

U.S. PATENT DOCUMENTS

| 11,375,149 | B2 | 6/2022 | Niwa |
| 2014/0291481 | A1* | 10/2014 | Zhang ................. H01L 27/1463 257/431 |
| 2018/0269242 | A1* | 9/2018 | Kawahito .............. H04N 25/63 |
| 2020/0169675 | A1 | 5/2020 | Stobie et al. |
| 2022/0102403 | A1* | 3/2022 | Ma .......................... H04N 25/46 |
| 2022/0201236 | A1* | 6/2022 | Gao ..................... H04N 25/443 |
| 2022/0310678 | A1* | 9/2022 | Li ..................... H01L 21/76843 |

FOREIGN PATENT DOCUMENTS

EP    2787531 A1    10/2014

OTHER PUBLICATIONS

European Search Report in European Patent Application No. 22315345. 3, dated Apr. 6, 2023, 7 Pages.

* cited by examiner

*Primary Examiner* — Georgia Y Epps
*Assistant Examiner* — Monica T Taba

(57) ABSTRACT

A merged frame-based and event-based image sensor pixel is provided, comprising a reverse-biased photodiode; a frame-based signal readout circuit connected to a cathode of the photodiode; and an event-based signal readout circuit connected to an anode of the photodiode. Light received in the photodiode causes the production of electrons and holes. The recombination current of the holes is continuously measured for producing the event-based signal.

10 Claims, 2 Drawing Sheets

MERGED FRAME-BASED AND EVENT-BASES IMAGE SENSOR PIXEL

CROSS-REFERENCE TO RELATED APPLICATION

This application is based on and claims priority under 35 U.S.C. 119 to European Patent Application No. 22315345.3 filed on Dec. 21, 2022, the disclosure of which is herein incorporated by reference in its entirety.

TECHNICAL FIELD

The disclosure relates to imagers, in particular an imager combining pixels for sensing spatial image information and pixels for detecting brightness change information.

BACKGROUND

Imagers that capture video are referred to herein as frame-based imagers, i.e., they sample an image and produce frames at a fixed frame rate. Another type of imager, referred to as event-based, continuously monitors a scene to detect brightness changes in individual pixels. As soon as a change is detected in any individual pixel, the imager produces an event identifying the pixel and the amount of change, usually a brightness value that varies by a positive or negative threshold level with respect to its previous value.

Event-based imagers can detect changes with a very fine time resolution, in the order of microseconds, but they do not produce visually exploitable images, and are therefore mainly used in machine vision applications.

In some applications it is desired to combine frame-based and event-based information of a same scene under observation. Rather than observing the scene with two imagers, which would cause synchronization and parallax issues, hybrid imagers have been designed that combine frame-based and event-based imaging in a single imager array.

A relatively simple hybrid sensor includes an array of frame-based sensor pixels, often configured according to a Bayer filter pattern, where one of the two green frame-based pixels is replaced by an event-based pixel. Such a configuration somewhat reduces the frame-based image resolution and offers only a fraction of the resolution for the event-based imaging. Although the smaller resolution for the event-based imaging may be acceptable in some cases, the event-based pixels do not "see" all of the image, i.e., they do not receive the light that falls on the neighboring frame-based pixels, whereby the event-based imager may miss events.

FIG. 1 is a schematic diagram of a hybrid frame-based/event-based imager pixel, such as disclosed in US patent application US2021/0195130, that offers full resolution for both the frame-based imaging and the event-based imaging. Each pixel includes a photodiode PD that is time-shared between a frame-based readout circuit 10 and an event-based readout circuit 12. The photodiode PD has its anode connected to ground GND. The cathode of the photodiode is switchable between the two readout circuits 10, 12 by respective N-MOS transistors M1, M2 controlled by respective signals TX and EN. The transistor M1 connected to the frame-based readout circuit 10 is actually the transfer transistor of a conventional 4T CMOS sensor pixel.

In a frame-based operation phase, transistor M2 remains off (signal EN is inactive) and transistor M1 is operated with signal TX, when required, to transfer charges from the photodiode to the readout circuit 10. In an event-based phase, transistor M1 remains off and transistor M2 remains on so that the event-based readout circuit continually measures the reverse current in the photodiode.

Hence, the hybrid imager offers full resolution for both the frame-based images and the event-based information, however at the cost of blind intervals for the event-based information. Indeed, during the frame-based image capture phases, no event-based information can be gathered.

SUMMARY

A merged frame-based and event-based image sensor pixel is provided, generally comprising a reverse-biased photodiode; a frame-based signal readout circuit connected to a first of two terminals of the photodiode; and an event-based signal readout circuit connected to the second of the two terminals of the photodiode.

The second terminal of the photodiode may be an anode, and the event-based readout circuit be configured to bias the anode at a constant voltage lower than the cathode voltage and to establish a current path from the anode to a low supply line at a voltage lower than the anode voltage.

The photodiode may comprise a substrate including a p-type region forming the anode; an n-type implant in the substrate, forming the cathode of the photodiode; and a deep trench insulator surrounding the photodiode.

The deep trench insulator may be a capacitive deep trench insulator having a conductor core biased at a voltage lower than the anode voltage.

The event-based readout circuit may comprise a logarithmic transimpedance amplifier including a first P-MOS transistor having a gate connected to the anode of the photodiode, a source receiving a supply voltage that determines the anode bias voltage, and a drain connected to a low supply line through a current source, wherein the current source is sized to make the first transistor operate in sub-threshold conditions; and a second P-MOS transistor having a source connected to the anode of the photodiode, a drain connected to the low supply line, and a gate connected to the drain of the first transistor.

A merged frame-based and event-based imager may comprise an array of pixels as disclosed above.

The pixels may be distributed in groups of adjacent pixels, each pixel of a group having a respective frame-based readout circuit, and the pixels of the group sharing one event-based readout circuit, whereby each group merges a single event-based pixel with multiple frame-based pixels.

Each group may include four frame-based pixels configured in a Bayer pattern.

A method for simultaneously sensing frame-based imaging signals and event-based imaging signals is also provided, generally comprising the steps of receiving light in a photodiode, causing the production of electrons and holes; collecting the electrons for producing one of a frame-based image signal and an event-based image signal; and simultaneously using the holes for producing the other of the frame-based image signal and the event-based image signal.

The method may comprise the further steps of creating a current path from an anode of the photodiode to a supply line at a voltage lower than a voltage at the anode; recombining the holes through the current path; and measuring the current in the current path for producing the event-based image signal.

BRIEF DESCRIPTION OF THE DRAWINGS

Embodiments will be exposed in the following description provided for exemplary purposes only, in relation to the appended drawings, in which.

DETAILED DESCRIPTION

As previously mentioned, hybrid event-based/frame-based imagers operate according to alternating phases where one type of imager is active at a time. When the frame-based imager is active, the event-based imager is inactive and blind to events happening during this phase, which may cause events to be missed.

Rather than providing such a time-sharing hybrid imager, the present disclosure provides a merged dual function imager where both types of imagers are simultaneously and continuously active. Such a merged imager includes a frame-based imager that operates continuously under its normal conditions, in particular by collecting and transferring electrons generated by light in the photodiode structure. The event-based imager is configured to operate simultaneously with the holes that are coproduced with the electrons in the photodiode structure, and which conventionally serve no purpose and are "discarded".

Figure 1:
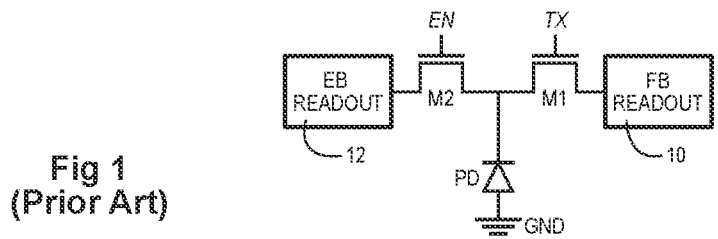
FIG. 1 illustrates a schematic diagram of a conventional hybrid frame-based and event-based imager pixel.
Figure 2:
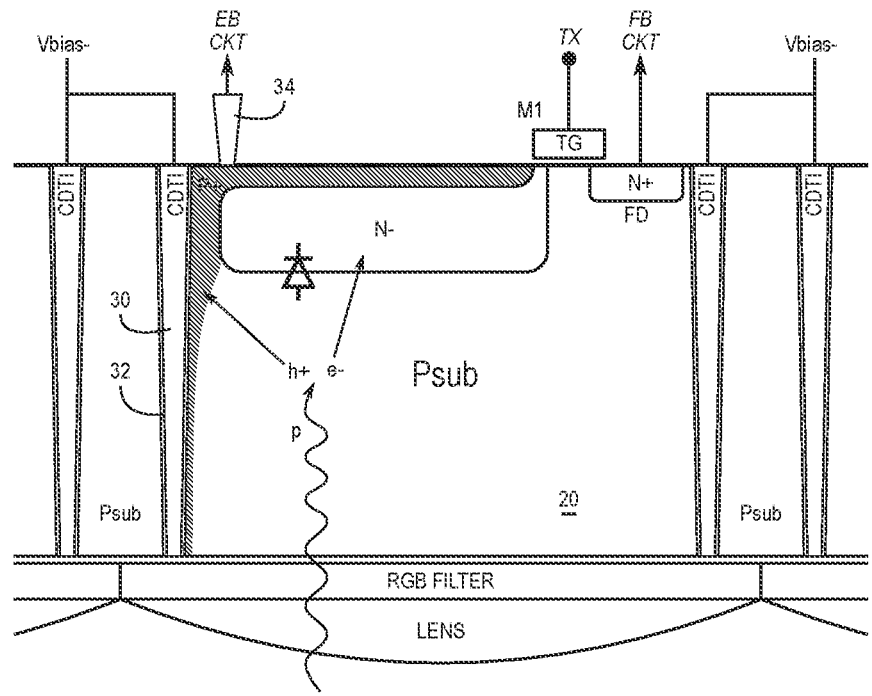
FIG. 2 illustrates a schematic cross section of an embodiment of a merged event-based and frame-based image sensor pixel.

FIG. 2 illustrates a schematic cross section of an embodiment of an image sensor pixel serving as a basis for merging event-based and frame-based functionality. Conductivity types N and P may be suffixed by signs "+" or "−", indicating relative carrier concentrations. The pixel is typically formed in a p-type substrate 20 of a chip that may be fabricated according to a dedicated CMOS Image Sensor technology (CIS). The photodiode includes a cathode formed by an n-type implant N− that occupies most of the pixel's surface area and an anode formed by the bulk of the substrate. The photodiode is pinned, i.e., a p-type layer P+ extends almost entirely over the N− implant, leaving only an edge exposed for a transfer transistor, in fact the transfer transistor M1 of the frame-based part of the pixel. The transfer transistor includes a gate TG formed by a conductor, for instance polysilicon, bridging a substrate gap between the edge of the N− implant and an n-type floating diffusion (FD) node N+. The gate conductor TG is separated from the surface of the substrate by an insulating layer, for instance aluminum oxide. The gate conductor receives the transfer control signal TX through a conductor formed in metal layers of the chip. The floating diffusion FD is connected to the rest of the frame-based pixel circuit also through conductors formed in metal layers of the chip. This circuit typically includes a few transistors also implemented in CIS technology in an edge region of the pixel, not visible in the cross section.

The illustrated pixel is a so-called backside illuminated pixel, i.e., light enters from the backside of the chip (the bottom of the shown structure) to which color filters and microlenses may be attached, as shown.

Moreover, as shown, the pixel may be surrounded by a deep trench insulator, such as a Capacitive Deep Trench Insulator CDTI. A deep trench insulator extends throughout the thickness of the substrate, insulating the pixel from neighboring pixels in an array to avoid crosstalk through the bulk of the substrate. The space between the CDTI trenches of adjacent pixels may be used to layout the frame-based pixel circuitry.

A CDTI typically includes a polysilicon core 30 lined on either side by a dielectric layer 32, such as oxide. A capacitor is thus formed between the polysilicon core and the substrate bulk on the other side of the dielectric layer. The substrate region lining the dielectric layer may receive a p-type implant that improves the characteristics of the capacitive effect. Such an implant is shown in FIG. 2 on the left, where it merges with the P+ pinning layer along one side of the cathode implant N−.

The pixel structure described up to now corresponds to a conventional 4T CMOS backside image sensor pixel with CDTIs.

In a conventional pixel, the substrate, in fact the anode of the photodiode, is biased at a fixed low voltage, such as ground or 0V, that maintains the photodiode in a reverse-biased state and offers a recombination path for the photo-generated holes. When implementing CDTIs or other deep trench solutions, the substrate of each pixel is insulated from the substrates of the other pixels in the array, whereby the substrate of each pixel is individually biased such a through a contact 34 formed on the P+ layer. The polysilicon cores of the CDTIs may be biased at a voltage Vbias-lower than the bias voltage of the substrates, which is known to improve dark current performance.

Photons p penetrating the substrate, as shown, generate electrons e− and corresponding holes h+. The electrons e− are trapped and accumulate in the cathode implant N− while the holes h+, serving no purpose conventionally, are recombined at the substrate bias contact 34. The presence in that area of higher doped regions (P+), which have a higher conductivity, increases the mobility of the holes.

In the present disclosure, the substrate contact 34 is not passively biased to discard the holes, but "actively" biased by an event-based readout circuit, as indicated in the figure, to measure a current produced as the holes are recombined.

Making use of the holes has been proposed in other applications, such as for increasing the dynamics of frame-based pixels by adding a voltage produced by accumulating the holes to the voltage produced traditionally by the accumulation of electrons— see for instance [Lalanne, Frédéric, et al. "A native HDR 115 dB 3.2 µm BSI pixel using electron and hole collection." Proceedings of the International Image Sensor Workshop (2017)]. Such techniques are not readily applicable to event-based pixels.

Figure 3:
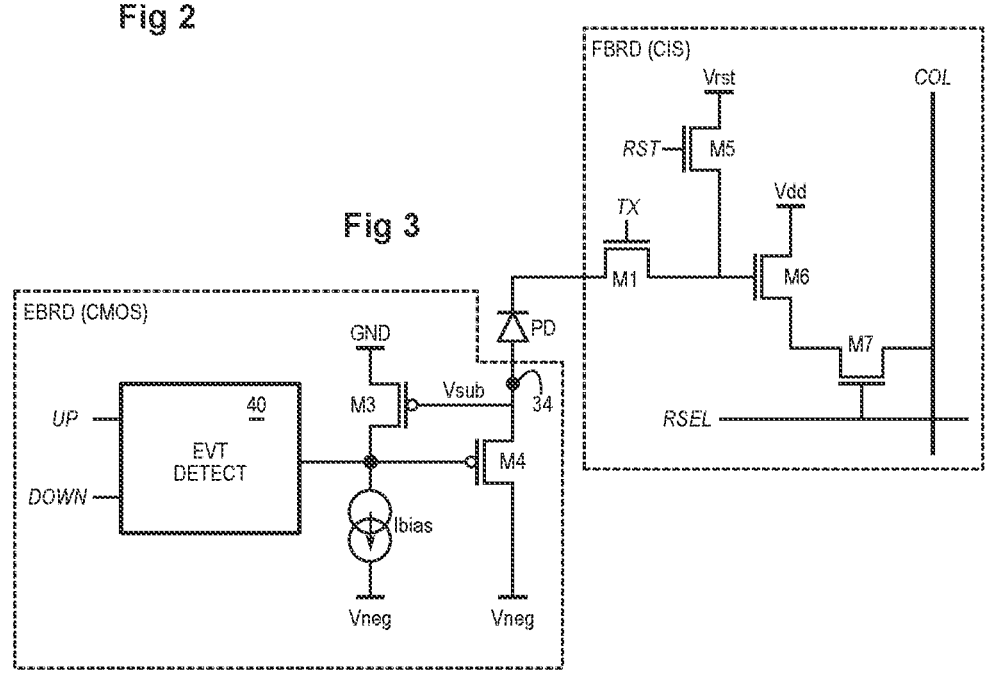
FIG. 3 illustrates an exemplary electrical diagram of readout circuitry for the pixel of FIG. 2.

FIG. 3 illustrates a more detailed electrical diagram of an exemplary event-based readout circuit EBRD combined with a frame-based readout circuit FBRD sharing the same photodiode structure of FIG. 2.

For the event-based part, the substrate/anode contact 34 is connected to the input of a transimpedance amplifier including two P-MOS transistors M3, M4. The transistor M3 has its gate connected to contact 34, i.e., the anode of the photodiode PD. The source of transistor M3 receives a constant voltage corresponding to the bias level desired for the anode/substrate, such as ground GND. The drain is connected to a negative supply line Vneg through a current source Ibias. The current source is sized to make the transistor M3 operate in sub-threshold conditions. The bias current may be in the order of picoamperes, the same order of magnitude than the average current produced by the hole recombination.

The transistor M4 has its source connected to the anode of the photodiode, its drain to the negative supply line Vneg, and its gate to the drain of the transistor M3.

With this configuration, both transistors establish at an operating point where their gate-source voltages Vgs match their drain currents. The bias current Ibias flows exclusively through transistor M3, whereby the transistor's Vgs voltage is constant and establishes a fixed substrate bias voltage Vsub on contact 34, below GND by the Vgs value, adapted to cause hole recombination.

The hole recombination drains a current that flows exclusively through the transistor M4 to the supply line Vneg and causes the Vgs value of this transistor to vary accordingly. In sub-threshold conditions, the Vgs voltage varies logarithmically with respect to the drain current, which is a preferred feature.

This variable voltage, tapped for instance on the node between the transistor M3 and the current source Ibias, is processed by a conventional event detection circuit 40 to produce, for instance, an UP event when the voltage rises by a threshold above a previous value, and a DOWN event when the voltage drops by a threshold below the previous value.

For the frame-based part FBRD, the circuit may be conventional, such as in a 4T CMOS sensor, including the previously mentioned transfer N-MOS transistor M1. The circuit further includes a reset N-MOS transistor M5 controlled by a reset signal RST and connected between the floating diffusion and a reset voltage line Vrst. A source follower N-MOS transistor M6 has its gate connected to the floating diffusion and is powered by a supply voltage line Vdd. Voltage Vrst may be equal to Vdd or slightly greater to improve the charge transfer from the photodiode to the floating diffusion. A row-select N-MOS transistor M7 is controlled by a select signal RSEL and connects the source of the follower transistor M6 to a column readout line COL. In a typical imager array, a same row-select signal RSEL controls the transistors M7 of the pixels in a same row, and the transistors M7 of the pixels in a same column are connected to transfer the pixel readings on a same readout line COL. The structure being conventional and well-known, it will not be further described.

Exemplary values of the voltages are:
GND: 0 V
Vdd=Vrst: 1.7 V
Vneg: −1.1 to −2 V
Vbias−: 0 to −2 V. This voltage could be Vneg.

Figure 4:
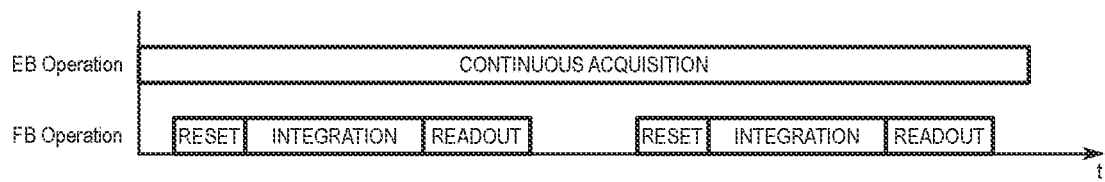
FIG. 4 is a simplified timing diagram of the operation of the pixel of FIGS. 2 and 3.

FIG. 4 illustrates a simplified timing diagram of the operation of a merged pixel structure as described above. The event-based part of the pixel operates in a continuous acquisition mode, continuously sensing the hole recombination current and triggering events asynchronously as they occur. The frame-based part of the pixel operates concurrently according to a pattern repeated periodically at the frame rate, the pattern including a reset phase, an integration phase, and a readout phase. In a correlated double-sampling operation (CDS), the reset phase includes a first readout of the floating diffusion voltage (the dark value). After the integration phase, the transfer gate transfers the electrons accumulated in the cathode to the floating diffusion, whereafter a second readout occurs.

In practice, the photodiode and the frame-based readout circuit are all manufactured on a same chip in CIS technology. The event-based readout circuit EBRD is more complex than a 4T pixel circuit, and may not be fully feasible in CIS technology, or not be sufficiently compact in CIS technology. Hence, the event-based circuitry may be manufactured on a separate chip in appropriate CMOS technology and stacked on the CIS chip using hybrid copper-to-copper bonding techniques. The bonding occurs via the front sides of the chips, which does not affect the light sensing, since the imager is a back side imager.

The circuitry of FIG. 3 is adapted to imager arrays where each pixel merges a frame-based readout with an individual event-based readout, i.e., the event-based imaging has the same resolution as the frame-based imaging. In some applications, the event-based imaging may have a smaller resolution than the frame-based imaging, for instance a quarter of the resolution. However, in such a case, the event-based imaging should still "see" the full surface of the observed scene and not discrete patches within the scene that would cause events that occur between the patches to be missed.

Figure 5A:
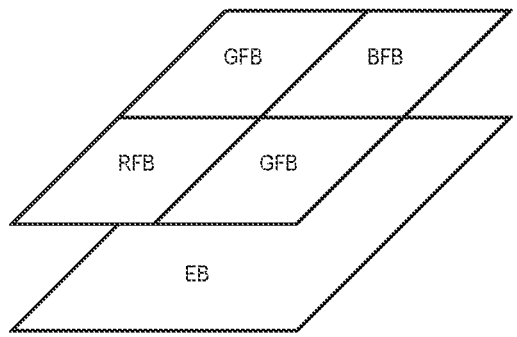
FIGS. 5A and 5B illustrate a pixel organization where one event-based pixel is merged with multiple frame-based pixels, according to another embodiment.
Figure 5B:
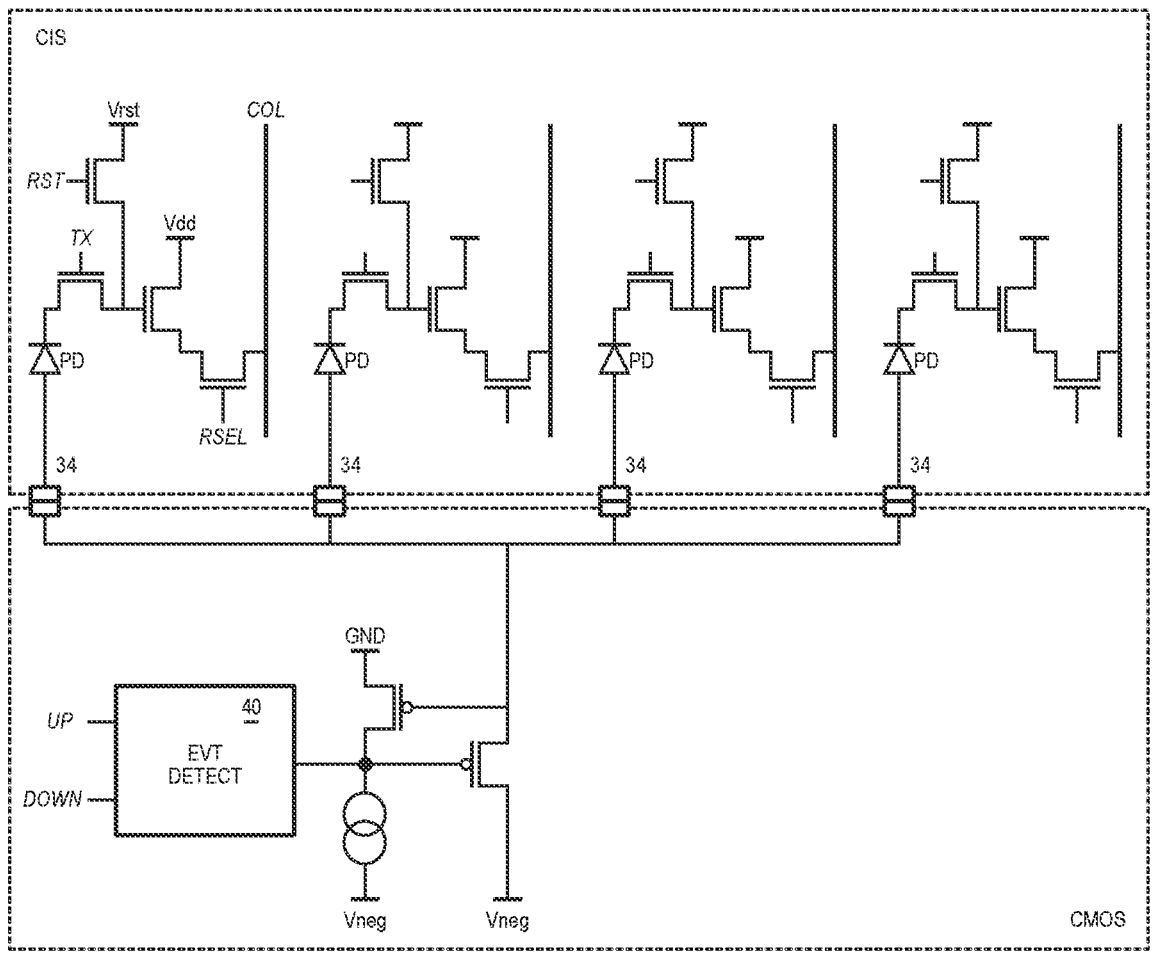

FIGS. 5A and 5B illustrate a pixel organization where one event-based pixel is merged with four frame-based pixels, according to an embodiment adapted to situations where a reduced resolution event-based imaging is acceptable, yet where the event-based imaging perceives the full surface of the observed scene.

In FIG. 5A a frame-based imager array is organized conventionally according to a Bayer pattern. The array is organized in squares of four adjacent pixels, two of which, in a diagonal, carry a green filter (GFB), another carries a red filter (RFB), and the remaining one carries a blue filter (BFB).

Each such group of four frame-based pixels is merged with one event-based pixel EB which, in effect, occupies the surface area of all four frame-based pixels, as shown.

FIG. 5B is an electrical diagram of such a 4-to-1 ratio merged pixel group. The four frame-based pixels of the group are each such as depicted in FIG. 3. However, instead of connecting each substrate contact 34 to a respective event-based readout circuit, the four substrate contacts 34 are connected together to a single event-based readout circuit, as the one depicted in FIG. 3. The single event-based readout circuit gathers the recombination currents of the holes produced in all four photodiodes, and thus produces an average reading for the full surface area of the four pixels.

The above Bayer pattern organization is only an example of an n-to-1 ratio merged pixel group. In situations where events are to be detected along a given direction, for instance vertically or horizontally, a single event-based readout circuit may be shared between all frame-based pixels of a row or a column.

As shown, the frame-based pixels including their photodiodes may all be fabricated on a chip in CIS technology, whereas the event-based readout circuits may be fabricated on a chip in CMOS technology. The two chips may then be bonded via the substrate contacts 34.

In some situations, the bulk of the substrate may be n-type, in which case p-type wells are implanted in the substrate and the components mentioned herein are formed in the p-wells.

In theory the positions of the event-based readout circuit and the frame-based readout circuit relative to the photodiode can be swapped. The event-based readout circuit would then operate conventionally from the cathode of the photodiode, by sensing the current of electrons. A frame-based readout circuit could operate with the substrate voltage produced by the holes—it may then have a 3T structure, where the reset transistor is an N-MOS transistor connected for pulling the otherwise floating substrate to a ground voltage, and the source follower and row-select transistors are preferably P-MOS.

The invention claimed is:

1. A merged frame-based and event-based image sensor pixel, comprising:
a reverse-biased photodiode;
a frame-based signal readout circuit connected to a cathode of the photodiode; and
an event-based signal readout circuit connected to an anode of the photodiode, wherein the event-based readout circuit is configured to bias the anode at a constant voltage lower than a cathode voltage and to establish a current path from the anode to a low supply line at a voltage lower than an anode voltage;
wherein the event-based readout circuit is configured to operate in a continuous acquisition mode, continuously sensing the anode current and triggering events asynchronously as they occur, and the frame-based readout circuit is configured to operate concurrently according to a pattern repeated periodically at a frame rate, the pattern including a reset phase, an integration phase, and a readout phase.

2. The image sensor pixel of claim 1, wherein the low supply line voltage is selected between −1.1 and −2 V, and the anode bias voltage is set below the cathode voltage by a gate-source voltage of a transistor.

3. The image sensor pixel of claim 1, wherein the photodiode comprises:
a substrate including a p-type region forming the anode;
an n-type implant in the substrate, forming the cathode of the photodiode; and
a deep trench insulator surrounding the photodiode.

4. The image sensor pixel of claim 3, wherein the deep trench insulator is a capacitive deep trench insulator having a conductor core biased at a voltage lower than the anode voltage.

5. The image sensor pixel of claim 1, wherein the event-based readout circuit comprises a logarithmic transimpedance amplifier including:
a first P-MOS transistor having a gate connected to the anode of the photodiode, a source receiving a supply voltage that determines the anode bias voltage, and a drain connected to a low supply line through a current source, wherein the current source is sized to make the first transistor operate in sub-threshold conditions; and
a second P-MOS transistor having a source connected to the anode of the photodiode, a drain connected to the low supply line, and a gate connected to the drain of the first transistor.

6. A merged frame-based and event-based imager, comprising an array of pixels according to claim 3.

7. The imager of claim 6, wherein the pixels are distributed in groups of adjacent pixels, each pixel of a group has a frame-based readout circuit, and the pixels of the group share one event-based readout circuit, whereby each group merges a single event-based pixel with multiple frame-based pixels.

8. The imager of claim 7, wherein each group includes four frame-based pixels configured in a Bayer pattern.

9. A method for simultaneously sensing frame-based imaging signals and event-based imaging signals, the method comprising the steps of:
receiving light in a photodiode, causing the production of electrons and holes;
collecting the electrons for producing a frame-based image signal;
reading out the frame-based image signal according to a pattern repeated periodically at a frame rate, the pattern including a reset phase, an integration phase, and a readout phase;
simultaneously using the holes for producing an event-based image signal; and
continuously sensing the event-based image signal for triggering events asynchronously as they occur.

10. The method of claim 9, comprising the steps of:
creating a current path from an anode of the photodiode to a supply line at a voltage lower than a voltage at the anode;
recombining the holes through the current path; and
measuring the current in the current path for producing the event-based image signal.

* * * * *